United States Patent
Yanagida

(10) Patent No.: US 6,525,937 B2
(45) Date of Patent: Feb. 25, 2003

(54) INFORMATION PROCESSING APPARATUS HAVING COOLING AIR PASSAGE WITH A PLURALITY OF HEAT GENERATING COMPONENTS INTERPOSED

(75) Inventor: Atsuhiro Yanagida, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/955,070

(22) Filed: Sep. 19, 2001

(65) Prior Publication Data
US 2002/0134531 A1 Sep. 26, 2002

(30) Foreign Application Priority Data

Mar. 22, 2001 (JP) ........................................ 2001-082695

(51) Int. Cl.[7] ................................................ H05K 7/20
(52) U.S. Cl. ...................... 361/695; 165/80.3; 361/719; 454/184
(58) Field of Search ......................... 312/236; 454/184; 165/80.3, 185, 121–126; 257/706, 707, 713, 721; 361/687, 690, 694, 695, 697, 703, 707, 720, 717–719, 722, 724–727, 752, 831

(56) References Cited

U.S. PATENT DOCUMENTS

| | | | | | |
|---|---|---|---|---|---|
| 5,285,350 | A | * | 2/1994 | Villaume | 361/690 |
| 5,446,619 | A | * | 8/1995 | Madsen et al. | 361/695 |
| 5,508,883 | A | * | 4/1996 | Lumbra et al. | 361/697 |
| 5,734,551 | A | * | 3/1998 | Hileman et al. | 361/695 |
| 5,818,694 | A | * | 10/1998 | Daikoku et al. | 361/703 |
| 5,949,645 | A | * | 9/1999 | Aziz et al. | 361/695 |
| 6,198,628 | B1 | * | 3/2001 | Smith | 361/695 |
| 6,359,781 | B1 | * | 3/2002 | Hoss et al. | 361/687 |

* cited by examiner

Primary Examiner—Gerald Tolin
(74) Attorney, Agent, or Firm—Finnegan, Henderson, Farabow, Garrett & Dunner, L.L.P.

(57) ABSTRACT

The information processing apparatus comprises a duct that forms a cooling air passage where cooling air flows, and a plurality of heat generating components which are cooled by cooling air that flows in the cooling air passage. The heat generating components are arranged displaced relative to the flowing direction of the cooling air as well as displaced one another in the direction crossing the cooling air flowing direction.

9 Claims, 13 Drawing Sheets

INFORMATION PROCESSING APPARATUS HAVING COOLING AIR PASSAGE WITH A PLURALITY OF HEAT GENERATING COMPONENTS INTERPOSED

CROSS-REFERENCE TO RELATED APPLICATIONS

This application is based upon and claims the benefit of priority from the prior Japanese Patent Application No. 2001-082695, filed Mar. 22, 2001, the entire contents of which are incorporated herein by reference.

BACKGROUND OF THE INVENTION

1. Field of the Invention

The present invention relates to an information processing apparatus with a plurality of heat generating components such as microprocessors housed inside the housing, and more specifically to the construction of cooling the heat generating components.

2. Description of the Related Art

For example, the rack-mount type server comprises a stand called a cabinet rack and a server body that is supported by the stand. The server body has a box-form housing and inside this housing, microprocessors, CD-ROM drive, power supply unit, a plurality of hard disk drives, and other various functional parts housed in a lump.

The server body that handles a large volume of data has two microprocessors equipped for increased processing speed. These microprocessors are mounted side by side on a main circuit board called a motherboard. The microprocessors cannot avoid an increase of heat generation as the processing speed increases. Consequently, in order to secure the stable operation of the server body, it is necessary to increase the heat radiation capacity of microprocessors. To achieve this, in the conventional server body, heat sinks are mounted to the microprocessors and an electrically-operated fan is housed inside the housing. The electrically-operated fan supplies cooling air to the heat sinks and microprocessors in accord with the operating condition of the server body. By this, the microprocessors are forcibly cooled.

However, the two microprocessors are placed side by side in the condition so close to each other in order to downsize the main circuit board that they cannot be said that they are thermally insulated. Consequently, the heat discharged from one microprocessor may be transmitted to the other microprocessor. As a result, even if cooling air is fed to the heat sink that deprives each microprocessor of the heat, cooling air heated by exchanging heat with the one heat sink may be blown on the other heat sink or microprocessor.

Consequently, the two microprocessors exert thermal influences to each other and even though these two microprocessors are made to forcibly air-cool, the desired cooling effects are unable to be obtained from the microprocessors.

In addition, by the above configuration, much of the cooling capacity of microprocessor depends on the air-feeding capacity of the electrically-operated fan. Consequently, increasing the air volume of cooling air can increase the cooling capacity of microprocessor. However, in order to increase the cooling air volume, the rotating speed of the electrically-operated fan must be increased or a large-size electrically-operated fan with excellent blowing capacity must be used. This will increase operating sound of electrically-operated fan and causes noises or a wide space for installing the electrically-operated fan must be secured inside the housing, and cannot be an effective solution.

BRIEF SUMMARY OF THE INVENTION

Accordingly, it is an objective of the present invention to provide an information processing apparatus that can prevent a plurality of heat generating components from exerting thermal influences one another and that can efficiently cool these heat generating components.

In order to achieve the above object, an information processing apparatus according to a first aspect of the present invention comprises; a duct that forms a cooling air passage through which cooling air flows; and a plurality of heat generating components which are cooled by the cooling air that flows the cooling air passage. The heat generating components are arranged displaced relative to the flowing direction of the cooling air as well as displaced one another in the direction crossing the cooling air flowing direction.

An information processing apparatus according to a second aspect of the present invention comprises; a circuit board housed in a housing and equipped with a mount surface; a plurality of heat generating components arranged and mounted on the mount surface of the circuit board; a duct installed to the mount surface of the circuit board, the duct having formed an independent cooling air passage in the housing inside and the heat generating components having been located in the cooling air passage; and an air feeding means for feeding cooling air to the cooling air passage. The heat generating components are arranged displaced relative to the flowing direction of the cooling air as well as displaced one another in the direction crossing the cooling air flowing direction.

By this kind of configuration, the cooling air that flows the cooling air passage has the flow direction guided by the duct, and therefore, the cooling air flow is not diffused around a plurality of heat generating components but the cooling air can be concentratedly guided to these heat generating components.

Moreover, the heat generating components do not overlap along the cooling air flow direction and high-temperature cooling air heated by the heat exchange with other heat generating component is not guided to any of the heat generating component. At the same time, the outer peripheral surfaces of these heat generating components are not brought closer as is the case when the heat generating components are arranged in parallel. Consequently, the outer peripheral surfaces of the heat generating components can be exposed to the cooling air passage over a wide range, and the sufficiently wide contact area can be secured between individual heat generating components and cooling air.

As a result, adjacent heat generating components do not exert thermal influences to one another and heat generating components can be efficiently cooled without increasing the air volume of cooling air.

In order to achieve the above object, an information processing apparatus according to a third aspect of the present invention comprises; a housing equipped with a removable top plate; a circuit board which is housed in the housing and which has a mount surface that opposes to the top plate; a duct that is removably housed in the housing inside, the duct having formed a cooling air passage independently from the housing inside on the mount surface of the circuit board; a plurality of heat generating components removably mounted on the mount surface of the circuit board and cooled by cooling air that flows the cooling air passage, the heat generating components having been arranged relative to the flowing direction of the cooling air as well as displaced one another in the direction crossing the cooling air flowing direction; and a power supply unit housed inside the housing, the power supply unit having been installed to the place deviated from the duct.

According to this kind of configuration, same as the first and the second embodiments according to the present invention, it is possible to prevent adjacent heat generating components from exerting thermal influences on one another. In addition, since the power supply unit is housed inside the housing at the position deviated from the duct, the heat generating components can be exposed on the circuit board only by the operation to remove the top plate of the housing and the duct. Consequently, for example, even if the heat generating components must be replaced, it is no longer necessary to remove a heavy and large power supply unit from the housing and assemble it to the housing each time. Consequently, the operability at the time of removing and mounting heat generating components can be improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiment of the invention, and together with the general description given above and the detailed description of the embodiment given below, serve to explain the principles of the invention.

DETAILED DESCRIPTION OF THE INVENTION

Referring now to drawings applied to the rack mount type server, the embodiment of the present invention will be described in detail as follows.

Figure 1:
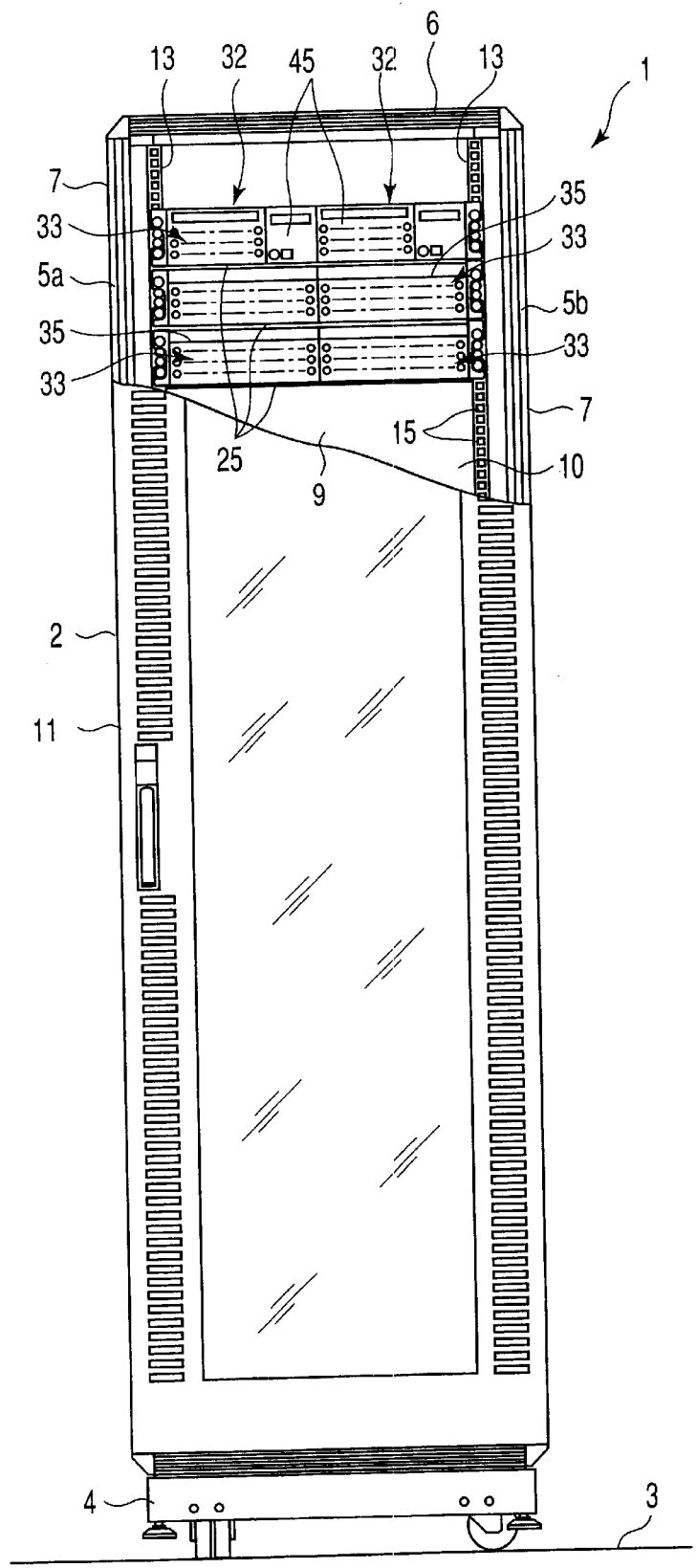
FIG. 1 is a front view of the rack-mount type server related to an embodiment according of the present invention.

FIG. 1 discloses a rack-mount type server 1 as an information processing apparatus. Server 1 is equipped with a stand 2 called a cabinet rack. The stand 2 is formed into a box shape of a longer side extending along the perpendicular direction.

Figure 2:
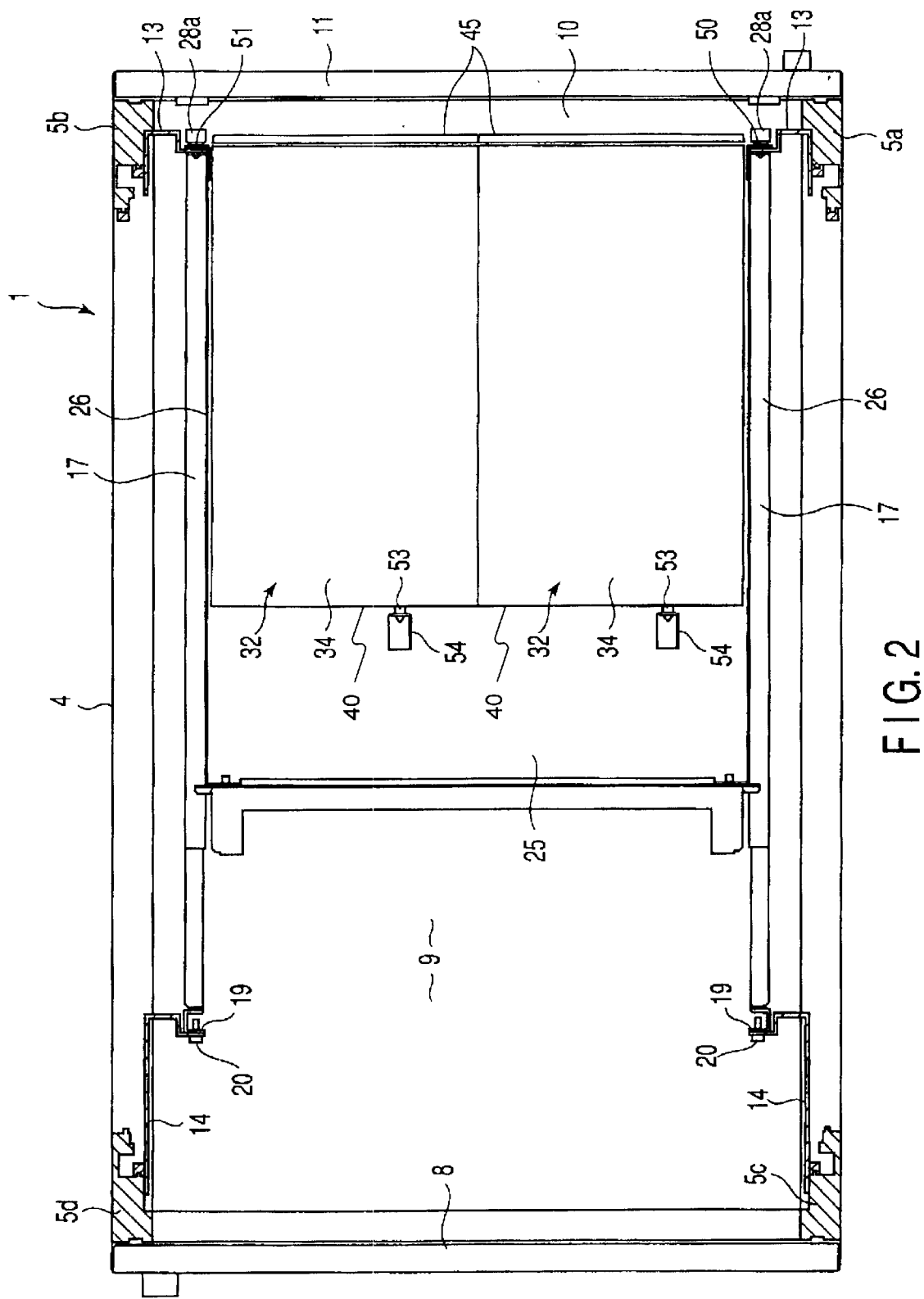
FIG. 2 is a cross-sectional view of the server showing two server bodies are housed in an equipment storage chamber inside a stand.

As shown in FIG. 1 and FIG. 2, the stand 2 comprises a pedestal 4 installed on a floor surface 3, four columns 5a to 5d perpendicularly erected from four corners of the pedestal 4, and a top plate 6, right and left side plates 7, and a rear plate 8 that are fixed to the columns 5a to 5d. These pedestal 4, top plate 6, right and left side plates 7, and rear plate 8 define an equipment storage chamber 9 in the stand 2.

The frame 2 has an opening 10 on the front surface. The opening 10 extends in the height direction of the stand 2 and is continuous with the equipment storage chamber 9. This opening 10 is opened and closed by a door 11 mounted to the front end of the stand 2.

Figure 3:
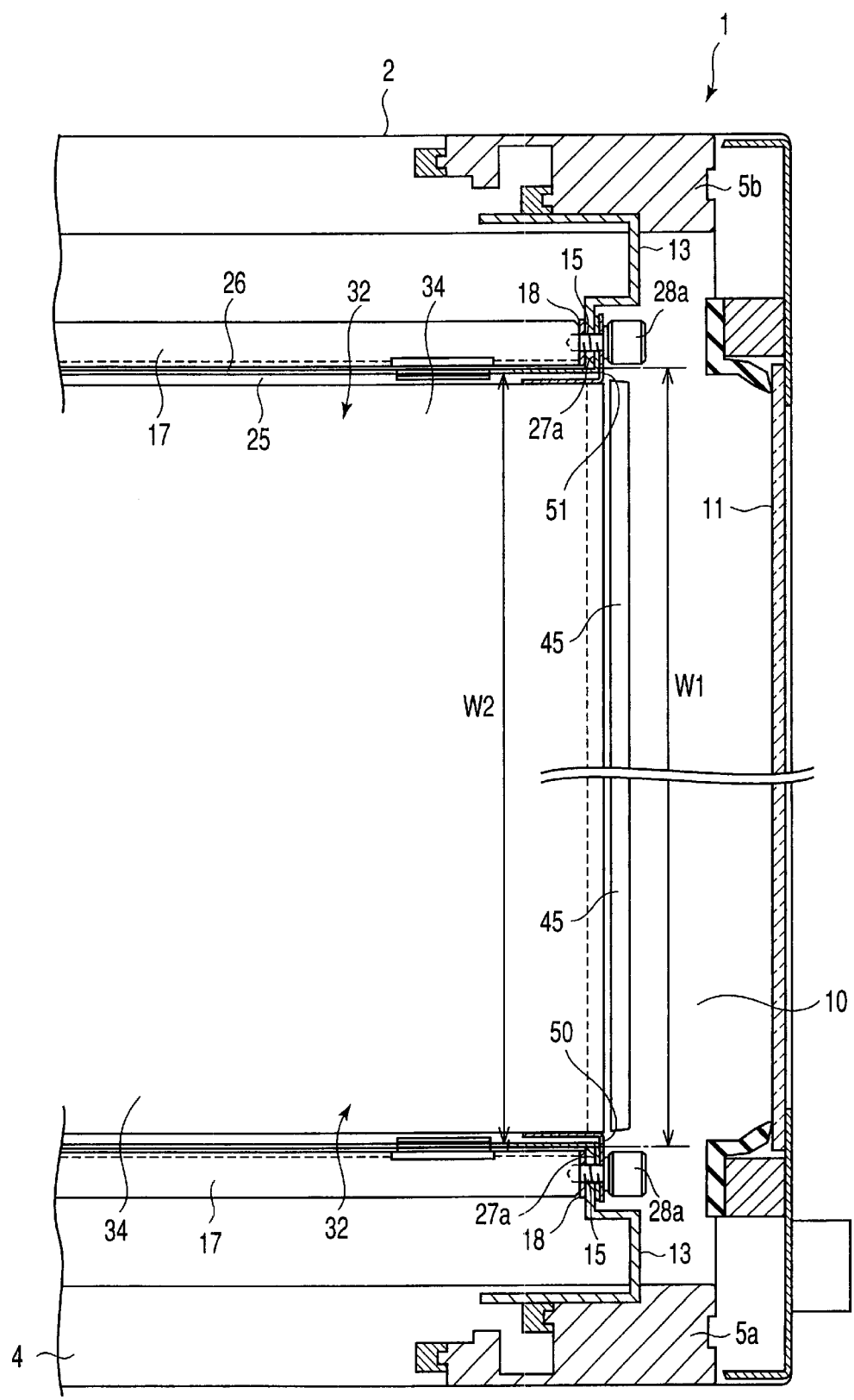
FIG. 3 is a cross-sectional view of the server showing structures for connection between the stand and the front end section of a shelf and between the shelf and the front end section of the server body.

As shown in FIG. 2 and FIG. 3, the two columns 5a, 5b located at the front end of the pedestal 4 face each other with the opening 10 in-between. Mount frames 13 are fixed to the columns 5a, 5b, respectively. The mount frames 13 extends along the height direction of the stand 2, and exposes to the opening 10. Consequently, a width W1 of the opening 10 is determined by the arrangement intervals of the mount frames 13, and in the conventional standard 19-inch stand, the width W1 of the opening 10 is set to about 450 mm.

Figure 4:
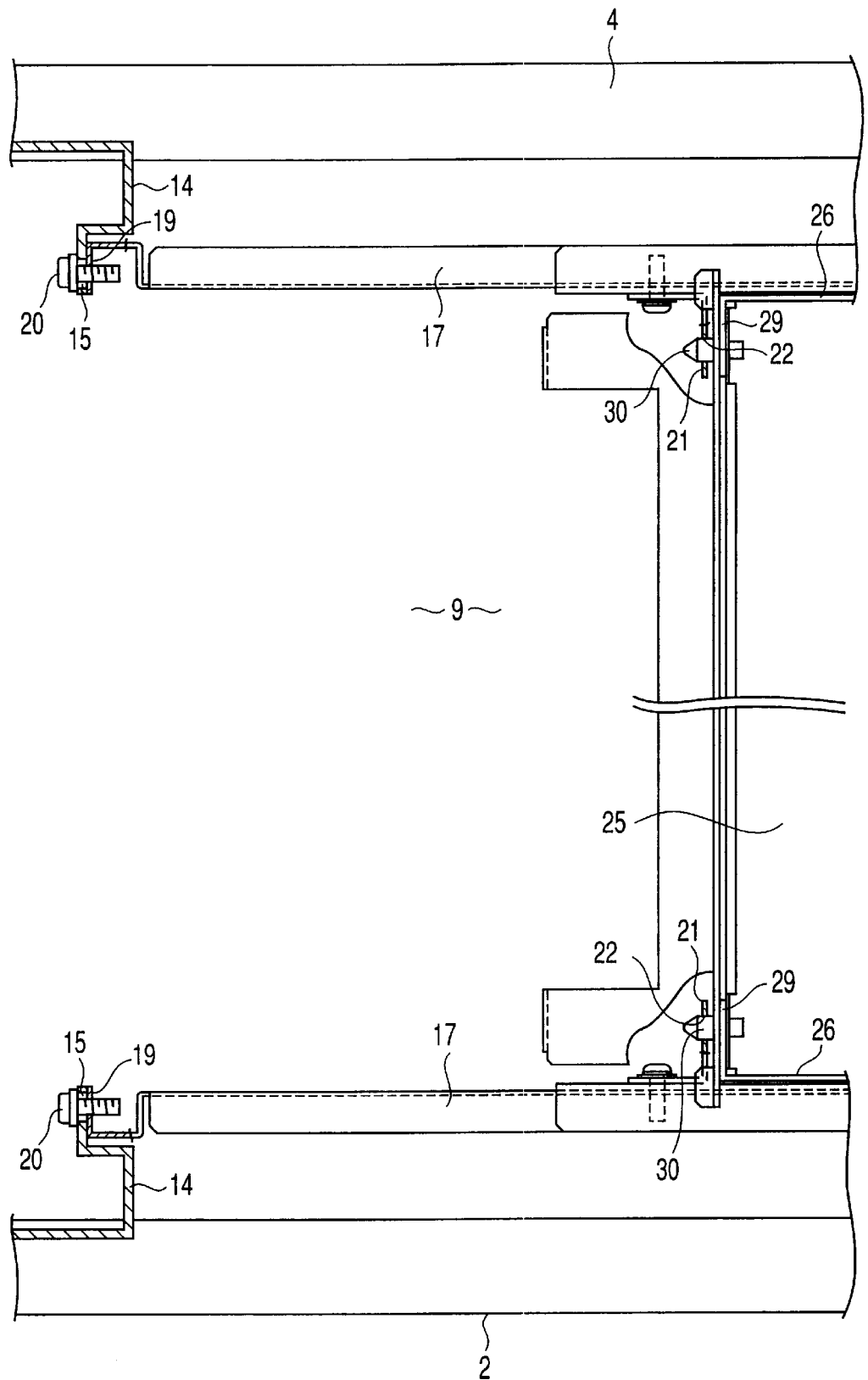
FIG. 4 is a cross-sectional view of the server showing structures for connection between the stand and the rear end section of the shelf and between the shelf and the rear end section of the server body.

As shown in FIG. 2 and FIG. 4, rear frames 14 are fixed to the two columns 5c, 5d that are situated at the rear end of the pedestal 4, respectively. The rear frames 14 extends along the height direction of the stand 2. The rear frames 14 and the mount frames 13 face each other in the depth direction of the stand 2. Each of the mount frames 13 and the rear frames 14 has a large number of through holes 15, respectively. These through holes 15 are arranged in one line with intervals provided in the height direction of the stand 2.

As shown in FIG. 2 through FIG. 5, one set of brackets 17 are laid across between the mount frames 13 and the rear frames 14. Each bracket 17 has a flat plate form. Each bracket 17 has a first flange section 18 that is butted to each mount frame 13 and a second flange section 19 that is butted to each rear frame 14. The first and the second flange sections 18, 19 are fixed to the mount frame 13 and the rear frame 14, respectively, via a plurality of screws 20 in the height position corresponding to the required through holes 15.

Consequently, the brackets 17 are held horizontally along the depth direction of the stand 2 and at the same time faces each other in the width direction of the stand 2. In the case of the present embodiment, the brackets 17 are located individually in three positions that are spaced in the height direction of the stand 2.

Figure 5:
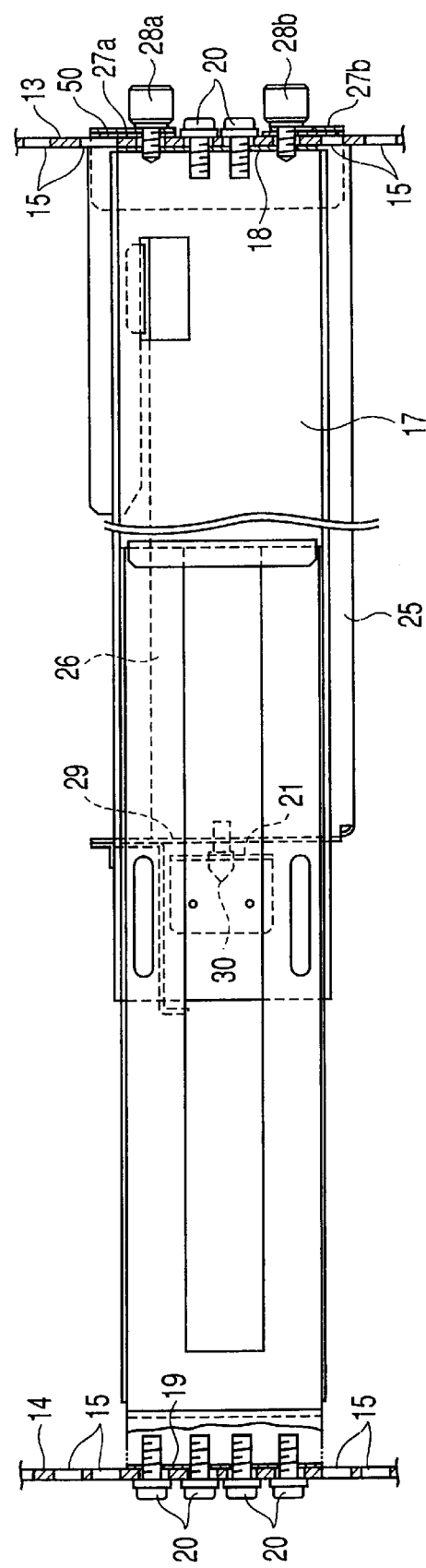
FIG. 5 is a cross-sectional view of the server showing the shelf fixed to the stand.

As shown in FIG. 4 and FIG. 5, a stopper 21 is fixed to each bracket 17. The stopper 21 protrudes into the equipment storage chamber 9 at the intermediate section along the depth direction of the stand 2. An engaging hole 22 is formed in the distal end section of each stopper 21.

As shown in FIG. 1, to the equipment storage chamber 9 of the stand 2, three shelves 25 are arranged. The shelves 25 are stacked one over the other with intervals in the height direction of the stand 2. As shown in FIG. 2 to FIG. 6B, each shelf 25 is arranged horizontally across brackets 17. Each shelf 25 has right and left side plates 26 that rise along the brackets 17. The shelves 25 are removably housed in the equipment storage chamber 9 through the opening 10 of the stand 2. Consequently, a width W2 of each shelf 25 is set to 440 mm or less, which is smaller than the width W1 of the opening 10.

Figure 6A:
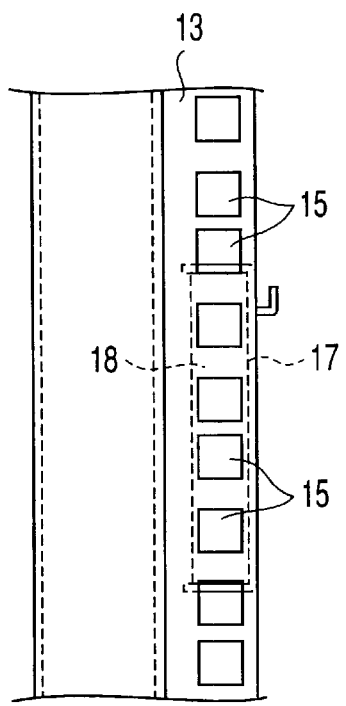
FIG. 6A is a front view showing the positional relationship between a mount frame and a bracket.
Figure 6B:
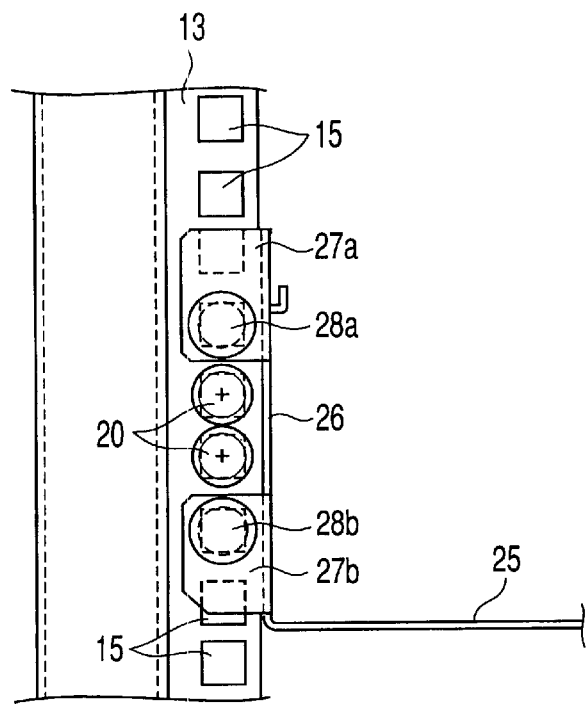
FIG. 6B is a front view showing the condition with shelf is fixed to the mount frame.
Figure 7:
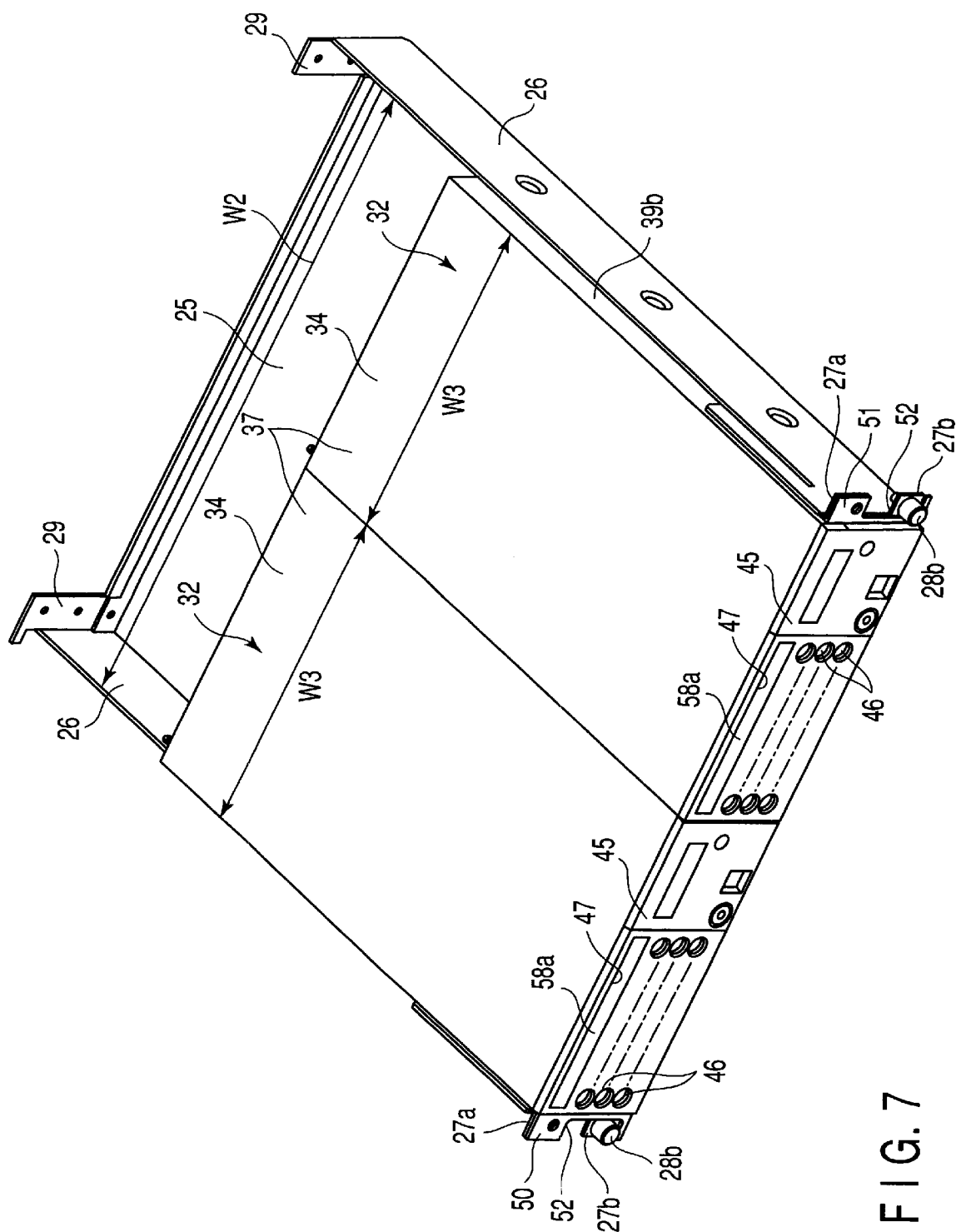
FIG. 7 is a perspective view showing two server bodies mounted to the shelf.

As shown in FIG. 6B and FIG. 7, each side plate 26 of the shelf 25 has a pair of tongue-piece sections 27a, 27b bent outwards at right angles at the front end section. The tongue-piece sections 27a, 27b are vertically arranged so as to face the their corresponding mount frame 13. The screws 20 that fasten each bracket 17 to its corresponding mount frame 13 are situated between the tongue-piece sections 27a, 27b. The tongue-piece sections 27a, 27b are fixed to each bracket 17 via decorative screws 28a, 28b. The decorative screws 28a, 28b pass through the through holes 15 and are driven into the first flange section 18 of each bracket 17. By this, the front end section of each shelf 25 is fixed to the desired height position of the mount frames 13 via the tongue-piece sections 27a, 27b.

As shown in FIG. 4, FIG. 5 and FIG. 7, each side plate 26 of each shelf 25 has a flange section 29 bent inwards at right angles at the rear end section. The flange section 29 faces the stopper 21 of the bracket 17 each other, and an engaging pin 30 protruding towards the stopper 21 is fixed to this flange section 29. The engaging pin 30 is fitted in the engaging hole 22 of the stopper 21, and by this, the rear end section of each shelf 25 is held on each bracket 17.

As observed in FIG. 1, the equipment storage chamber 9 of the stand 2 houses, for example, two server bodies 32 and four extension units 33. The two server bodies 32 are arranged side by side in the width direction on the shelf 25 at the top tier. The four extension units 33 are provided for increasing the storage capacity of the server bodies 32. These extension units 33 are arranged in pairs side by side in the width direction on two shelves 25 below the server bodies 32.

Figure 8:
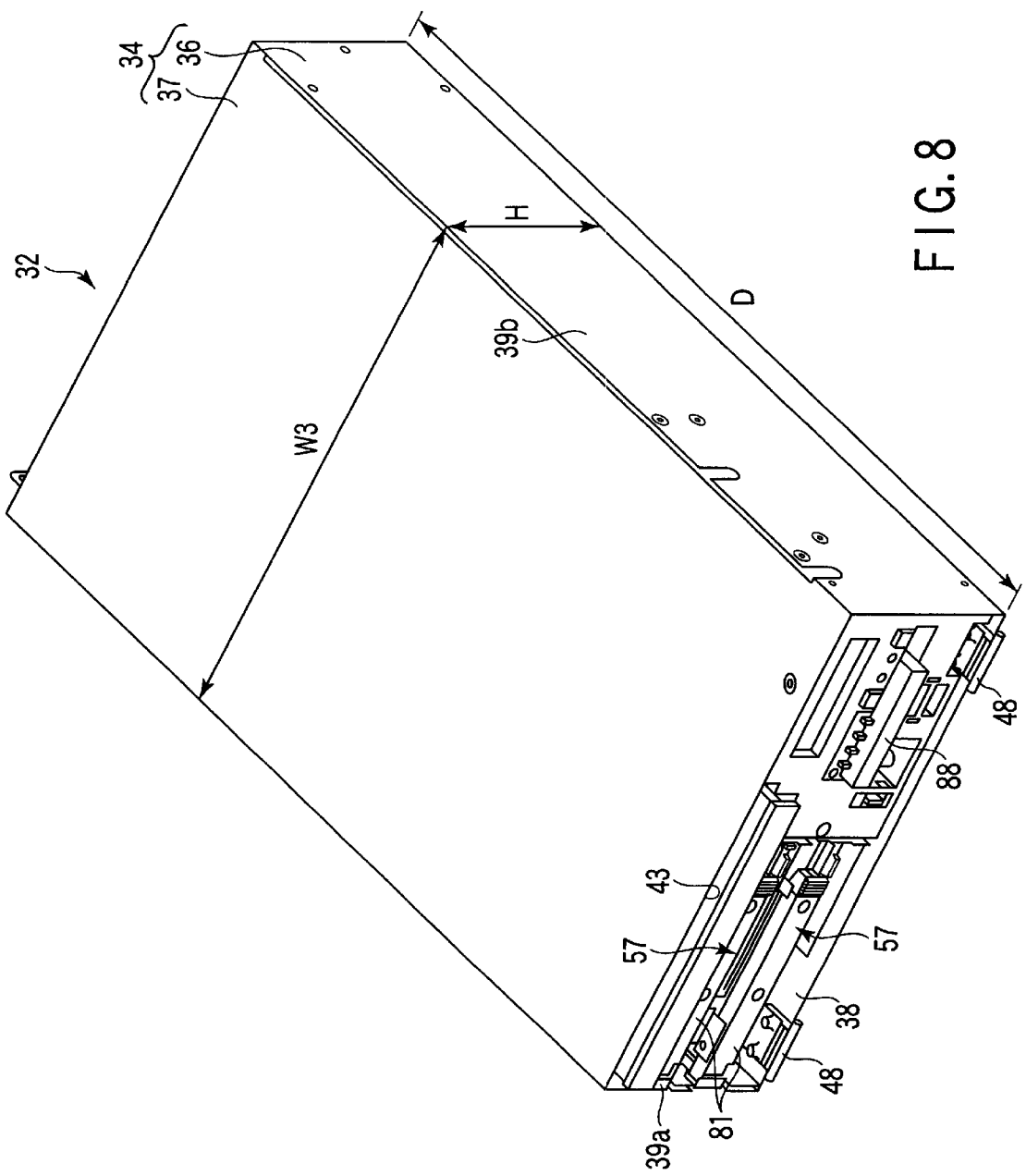
FIG. 8 is a perspective view of the server body.
Figure 9:
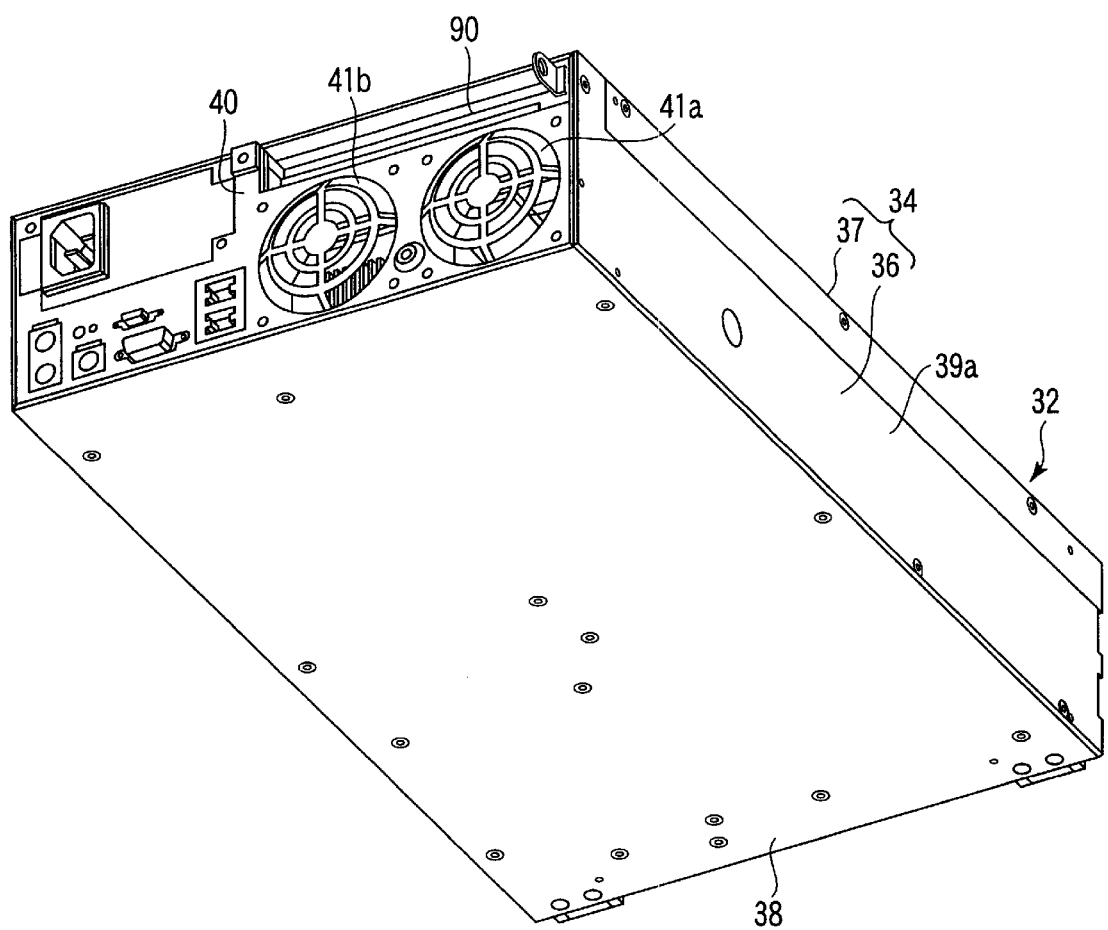
FIG. 9 is a perspective view of the server body as seen from the back.

FIG. 7 to FIG. 9 disclose the overall shape of each server body 32 as the information processing apparatus. Each server body 32 has a metal housing 34. The housing 34 is formed in a long and narrow rectangular box shape extending in the depth direction of the stand 2, and a width W3 is set to one half the width W2 of each shelf 25. Consequently, the respective housing 34 of each pair of server bodies 32 are arranged in the width direction of each shelf 25 on the shelf 25, and are held between the side plates 26 of the shelf 25.

The extension unit 33 has a metal housing 35 that houses, for example, four hard disk drives (not illustrated). The housing 34 of each server body 32 and the housing 35 of each extension unit 33 have the width W3, depth D, and height H set equal to each other. Consequently, it is able to arrange the server body 32 and the extension unit 33 side by side on one shelf 25, thereby rendering itself capable for accommodating various application forms.

As seen in FIG. 8 and FIG. 9, the housing 34 of the server body 32 comprises a housing body 36 and a top plate 37. The housing body 36 has a rectangular shape bottom plate 38, right and left side plates 39a, 39b, and a rear plate 40. The bottom plate 38 is laid on top of the shelf 25. The side plates 39a, 39b rise at right angles from the right and left side edge sections of the bottom plate 38. The rear plate 40 lies across the rear edge section of side plates 39a, 39b. To this rear plate 40, a pair of exhaust holes 41a, 41b are opened side by side. The top plate 37 is removably screwed to the upper end section of the side plates 39a, 39b and the upper end section of the rear plate 40 and faces the bottom plate 38. These top plate 37, bottom plate 38, side plates 39a, 39b, and rear plate 40 form a housing chamber 42 in the housing 34.

Figure 11:
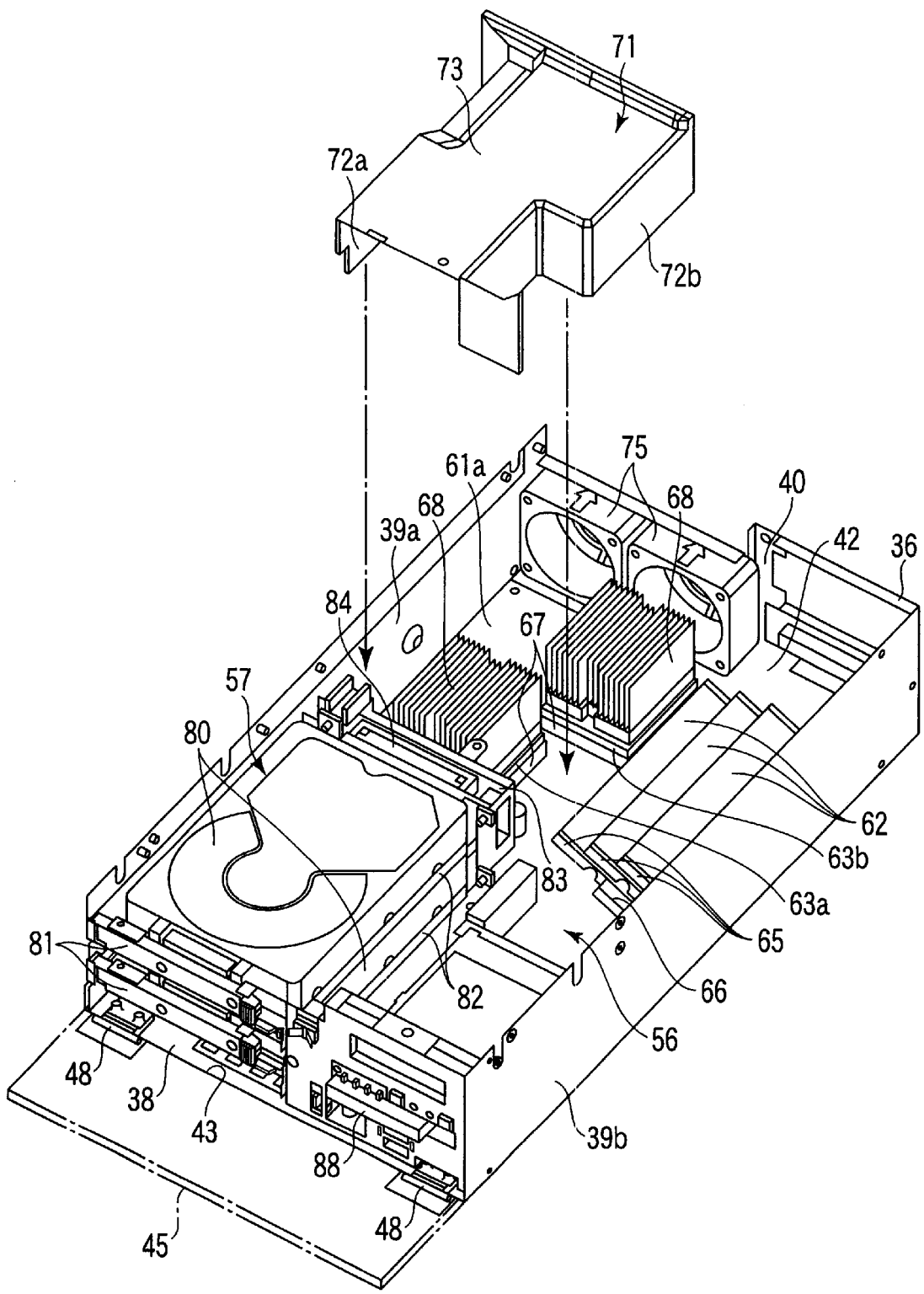
FIG. 11 is a perspective view of the server body breaking up and showing the positional relationship of duct, microprocessor, and heat sink.

The housing 34 has a rectangular loading gate 43 at the front end. The loading gate 43 has an opening that extends horizontally in the width direction of the housing 34 and continuous with the housing chamber 42. As shown in FIG. 7 and FIG. 11, a front door 45 that opens and closes the loading gate 43 is arranged at the front end section of the housing 34. The front door 45 has a rectangular plate form that agrees with the opening shape of the loading gate 43. The front door 45 has a large number of vent holes 46 and slit-form opening sections 47. The opening section 47 extends in the width direction of the housing 34 at the top of the left half of the front door 45.

The front door 45 is mounted to the front end section of the bottom plate 38 facing the loading gate 43 via a pair of hinges 48. Consequently, the front door 45 can rotatably cover the first position (shown in FIG. 7) where the door is erected perpendicularly to close the loading gate 43 and the second position (shown in FIG. 11) where the door collapses horizontally in front of the housing 34 to open the loading gate 43.

As seen in FIG. 3 and FIG. 7, of the two server bodies 32 placed on each shelf 25, the housing 34 of the left side server body 32 has a fitting 50 at the front end section of the side plate 39a on he left side. The fitting 50 is screwed to the side plate 39a and protrudes to the left side from the front end section of the side plate 39a. The housing 34 of the server body 32 located on the right side of the shelf 25 has the other fitting 51 at the front end section of the side plate 39b on the right side. The fitting 51 is screwed to the side plate 39b and protrudes to the right side from the front end section of the side plate 39b.

The fittings 50, 51 of each housing 34 are removably fixed to the mount frame 13 of the stand 2. Because this fixing structure is common for all the fittings, the fixing structure of the fitting 50 of the left-side housing 34 is described on behalf of all others.

Figure 6C:
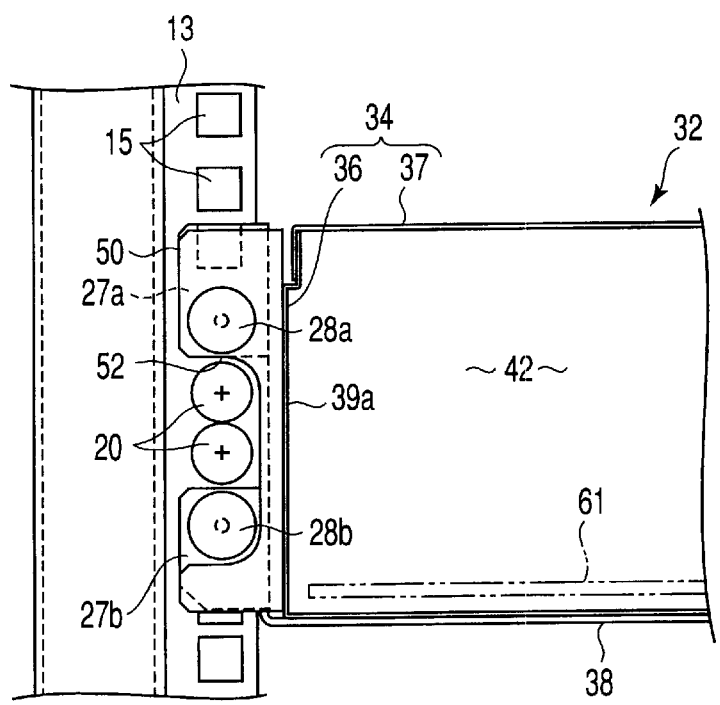
FIG. 6C is a front view showing the condition with the housing of the server body fixed to the mount frame.

As shown in FIG. 3, FIG. 5, and FIG. 6C, the fitting 50 is laid on the front surface of the tongue-piece sections 27a, 27b of the shelf 25. The fitting 50 has a notch 52. The notch 52 is to avoid the screws 20 for fixing the bracket 17 to the mount frame 13 and the decorative screw 28b for fixing the second tongue-piece section 27b to the mount frame 13. The fitting 50 has the top end section superimposed on the upper tongue-piece section 27a fixed to the mount frame 13 by the use of the decorative screw 28a. Consequently, the front end section of the housing 34 and the tongue-piece section 27a of the bracket 17 are fixed to the mount frame 13 via the common decorative screw 28a.

As shown in FIG. 2, to the rear plate 40 of housing 34, an engaging pin 53 that protrudes in the rear is mounted. The engaging pin 53 is removably fitted in a stopper 54 fixed to the rear part of the shelf 25, whereby the rear end section of the housing 34 is held to the shelf 25.

Figure 10:
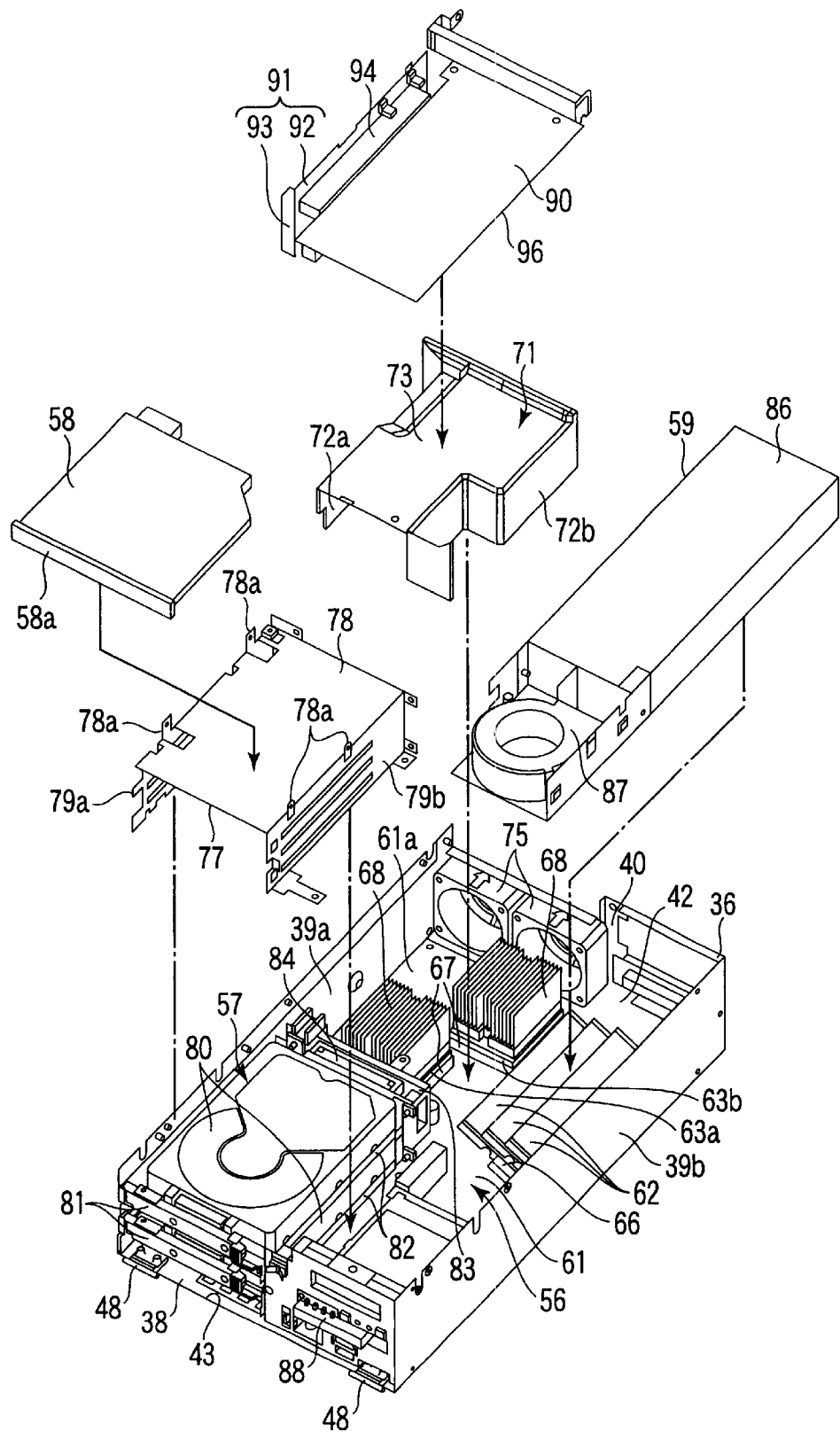
FIG. 10 is a perspective view of the server body breaking up and showing the positional relationship of main component elements such as duct, heat sink, extension card, and power supply unit.

As shown in FIG. 10, in the housing chamber 42 of the housing 34, a control circuit unit 56, two hard disk drive modules 57, CD-ROM drive 58, and power supply unit 59 are accommodated.

The control circuit unit 56 is located at the bottom of the housing chamber 42. The control circuit unit 56 is equipped with a main circuit board 61 called a motherboard, three memories 62 mounted to the main circuit board 61, and first and second microprocessors 63a, 63b.

The main circuit board 61 is screwed to the bottom plate 38 of the housing 34 and arranged horizontally along the bottom plate 38. The main circuit board 61 has a mount surface 61a on the opposite side of the bottom plate 38. The mount surface 61a faces the top plate 37 of the housing 34, and at the rear end of this mount surface 61a, the rear plate 40 is mounted.

Figure 13:
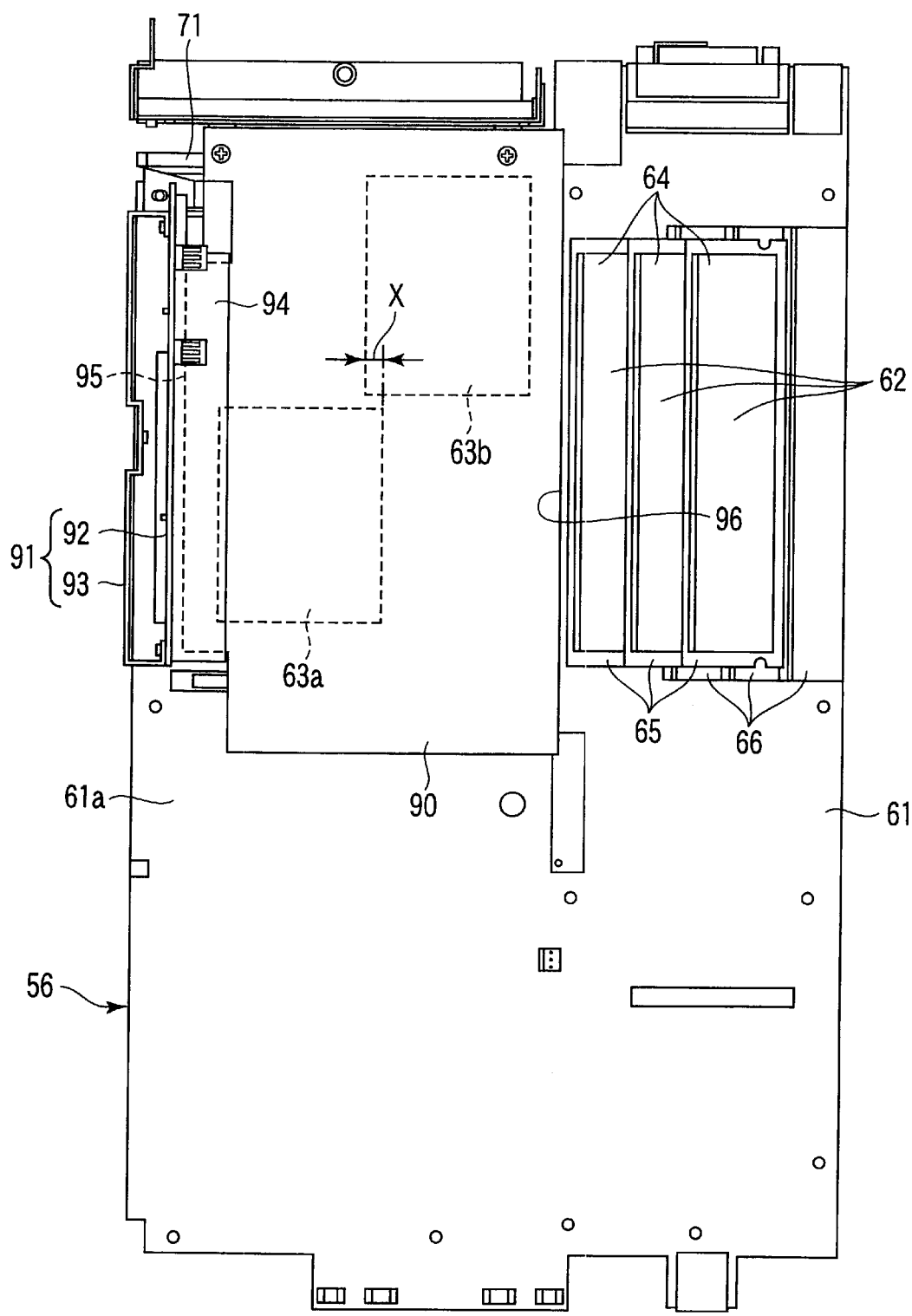
FIG. 13 is a plan view of the control circuit unit showing the positional relationship of the main circuit board, memory, and extension card.

The memories 62 and the first and the second microprocessors 63a, 63b are circuit components for processing the data, and are located at the rear half of the housing chamber 42. As seen in FIG. 13, each memory 62 has a long and narrow memory substrate 65 with a plurality of semiconductor packages 64 mounted. Each memory substrate 65 is mounted to the mount surface 61a of the main circuit board 61 via a socket 66. The memory substrates 65 extend to the depth direction of the housing 34 and are arranged parallel to the width direction of the housing 34 with intervals provided. In addition, the memory substrates 65 are tilted with respect to the main circuit board 61, with part overlapping over each other. By tilting the memory substrates 65 in this way, the overhang height of the memories 62 above the main circuit board 61 can be suppressed while securing the capacity of the memories 62.

The first and the second microprocessors 63a, 63b as heat generating components are formed with, for example, PGA type semiconductor packages. The first and the second microprocessors 63a, 63b are supported by sockets 67 fixed to the mount surface 61a of the main circuit board 61, and are located next to the memories 62 on the left. These microprocessors 63a, 63b are removable from the sockets 67.

The first and the second microprocessors 63a, 63b generate an extremely large volume of heat during operation in order to process a large volume of data at high speed, and require cooling for maintaining a stable action. Consequently, heat sinks 68 for promoting radiation are mounted to the top of the first and the second microprocessors 63a, 63b, respectively. The heat sinks 68 are thermally connected to the first and the second microprocessors 63a, 63b.

Figure 12:
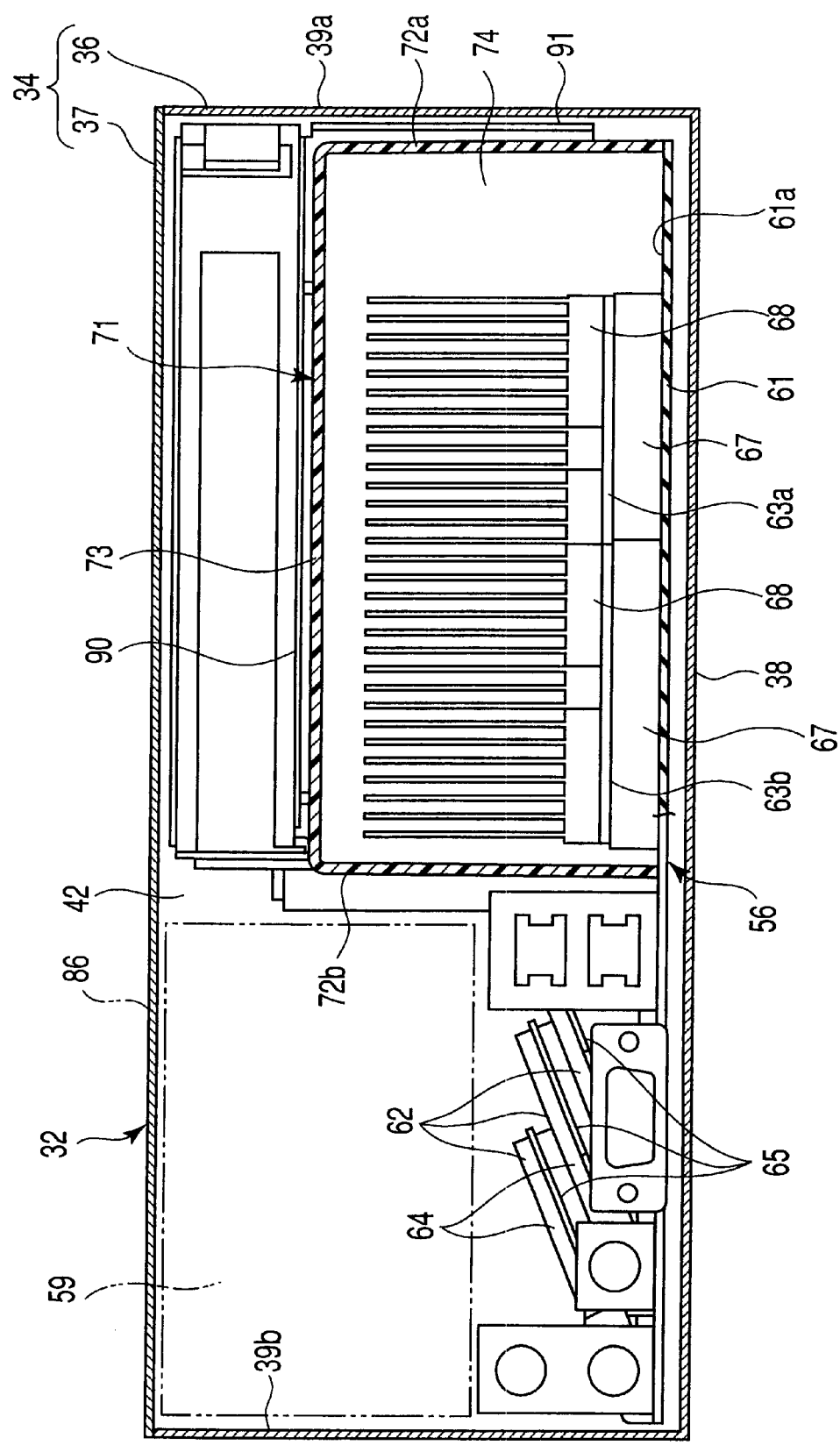
FIG. 12 is a cross-sectional view of the server body showing the positional relationship between the microprocessor with the heat sink and the duct.

In the housing chamber 42 of the housing 34, synthetic resin made duct 71 is removably accommodated. As shown in FIG. 11 and FIG. 12, the duct 71 has a pair of rising plates 72a, 72b and a top plate 73. The rising plates 72a, 72b rise from the mount surface 61a of the main circuit board 61, and face each other with the first and the second microprocessors 63a, 63b and heat sinks 68 in-between. The top plate 73 is arranged horizontally across the top end sections of the rising plates 72a, 72b, and faces the main circuit board 61.

The rising plates 72a, 72b and top plate 73 form a cooling air passage 74 above the mount surface 61a of the main circuit board 61. The cooling air passage 74 is independent from the space inside the housing 34 and is open to the front and the rear of the housing chamber 42 in the inside of this housing 34. The rear end that corresponds to the downstream end of the cooling air passage 74 is continuous with the vent holes 41a, 41b of the housing 34. The first and the second microprocessors 63a, 63b and the heat sinks 68 are located inside the cooling air passage 74.

As observed in FIG. 10 and FIG. 11, a pair of cooling fans 75 are installed to the rear end section of the housing chamber 42 as a air feeding means. The cooling fans 75 are supported to the rear plate 40 of the housing 34, and are interposed between the duct 71 and the vent holes 41a, 41b. The cooling fans 75 are arranged side by side in the width direction of the housing 34 at the downstream end of the cooling air passage 74.

When the cooling fans 75 are driven, air is sucked from the loading gate 43 at the front end of the housing 34 to the housing chamber 42. The majority of this air is guided to the cooling air passage 74 as cooling air. This cooling air is discharged to the outside of the housing 34 through vent holes 41a, 41b after it flows from the front to the rear in the cooling air passage 74.

As shown in FIG. 11 and FIG. 13, the first and the second microprocessors 63a, 63b are arranged displaced from each other along the cooling air flowing direction in the cooling air passage 74. Consequently, the first microprocessor 63a is located upstream of the cooling air passage 74 from the second microprocessor 63b. Furthermore, the first and the second microprocessors 63a, 63b are arranged displaced from each other along the direction crossing at right angles with the cooling air flowing direction, in other words, along the width direction of the housing 34, and are located at the front of the cooling fans 75, respectively.

In addition, as best shown in FIG. 13, the first and the second microprocessors 63a, 63b are arranged with such positional relation maintained that their adjoining end sections face each other along the depth direction of the housing 34. Consequently, when the first and the second microprocessors 63a, 63b are observed from the upstream side along the cooling air flowing direction, these microprocessors 63a, 63b slightly overlap each other by the size X along the width direction of the housing 34.

As shown in FIG. 10, a frame 77 is arranged at the left end section of the front half of the housing chamber 42. The frame 77 is arranged for holding two hard disk drive modules 57 to the housing chamber 42. The frame 77 has a horizontal top plate 78 and a pair of guide plates 79a, 79b. The guide plates 79a, 79b extend downwards from the right and left side edge sections of the top plate 78, and the lower end sections of these guide plates 79a, 79b are screwed to the mount surface 61a of the main circuit board 61. The front end of this frame 77 faces on the loading gate 43 of the housing 34.

In addition, a relay substrate 83 is arranged at the rear end opposite to the loading gate 43 of the frame 77. The relay substrate 83 is raised perpendicularly to face the loading gate 43. This relay substrate 83 is electrically connected to the main circuit board 61 via the connector (not illustrated) and has a pair of hard disk connectors 84 at the front surface that faces the loading gate 43.

The hard disk drive module 57 comprises a hard disk drive (hereinafter called "HDD") 80 and a tray 82 that supports the HDD 80, and a lever 81 for loading-unloading operation. The tray 82 is horizontally inserted between guide plates 79a, 79b of the frame 77 from the loading gate 43, and the right and left side edge sections of this tray 82 are slidably supported to the guide plates 79a, 79b. Consequently, two hard disk drive modules 57 are held to the frame 77 as if they are stacked on top of another. In the condition where each hard disk drive module 57 is held to the frame 77, HDD 80 is connected to the hard disk connector 84 and the lever 81 faces the loading gate 43.

The top plate 78 of the frame 77 covers the hard disk drive module 57 from above. The top plate 78 has a plurality of support pieces 78a extending upwards to the outer peripheral section. The top plate 78 also has a function as a bracket that supports the CD-ROM drive 58, and the CD-ROM drive 58 is screwed to the support piece 78a of this top plate 78. Consequently, the CD-ROM drive 58 is housed in the housing chamber 42 as if it lies on top of the hard disk drive modules 57. The CD-ROM tray 58a of the CD-ROM drive 58 is exposed to outwards of the housing 34 through the opening section 47 of the front door 45 when the front door 45 is located at the first position.

As seen in FIG. 10, the power supply unit 59 is equipped with a metal case 86 that houses various kinds of circuit components that generate heat such as transformers and a cooling fan 87 for cooling the circuit components. The case 86 forms a narrow and long box extending in the depth direction of the housing 34, and is assembled into the right end section of the housing body 36 as if it covers the memories 62 from above.

Consequently, the case 86 of the power supply unit 59 is housed in the region generated on the right side of the duct 71 and is deviated from above the first and the second microprocessors 63a, 63b. The cooling fan 87 is located at the front end section of the case 86 and is housed on the right side of the hard disk drive modules 57.

Below the cooling fan 87, a communication card 88 for achieving wireless LAN is arranged. The communication card 88 is exposed to the loading gate 43 of the housing 34, and as far as the front door 45 is located at the first position, the communication card 88 is covered with this front door 45.

As shown in FIG. 12 and FIG. 13, between the top plate 37 of the housing 34 and the top plate 73 of the duct 71, an extension card 90, for example, PCI type card, is housed. The extension card 90 is held in the rear half of the housing chamber 42 via the card supporter 91. The card supporter 91 has a bracket 93 integrated with an extension support card 92. The bracket 93 is screwed to the housing body 36 and is housed in a clearance between the side plate 39a on the left side of the housing body 36 and the duct 71.

The extension support card 92 is erected perpendicularly along the side plate 39a. The bottom end section of the extension support card 92 is electrically connected to the main circuit board 61. The top end section of the extension support card 92 overhung from the top plate 73 of the duct 71. To the top end section of the extension support card 92, an extension connector 94 is mounted. The extension connector 94 extends horizontally along the depth direction of the housing 34 and to this extension connector 94, a terminal section 95 of the extension card 90 is removably inserted. Consequently, the extension card 90 is arranged horizontally along the top plate 73 of the duct 71.

The extension card 90 has a side edge section 96 located on the side opposite to the terminal section 95. This side edge section 96 faces the case 86 of the power supply unit 59. This extension card 90 is supported by the top plate 73 of the duct 71 from below and by this, the positional relationship between the side edge section 96 of the extension card 90 and the case 86 is held constant. Consequently, interference between the circuit components (not illustrated) mounted to the extension card 90 and the case 86 is prevented.

Under this kind of configuration, the cooling fans 75 are driven in accord with the operating condition of the server body 32. By the drive of this cooling fans 75, air is sucked into the housing chamber 42 through the vent holes 46 of the front door 45. This air reaches the cooling air passage 74 above the main circuit board 61 while passing through the hard disk drive modules 57. The majority of this air flows from front to rear through the cooling air passage 74 as cooling air.

The cooling air comes in contact with the heat-generating first and the second microprocessors 63a, 63b as well as the heat sinks 68 thermally connected to these microprocessors 63a, 63b, and forcibly cools these microprocessors 63a, 63b and heat sinks 68. The cooling air heated by heat exchange between microprocessors 63a, 63b and heat sinks 68 is discharged to the rear of the housing 34 through vent holes 41a, 41b.

According to this kind of the cooling system, the duct 71 forms the cooling air passage 74 independent from that inside the housing 34 on the mount surface 61a of the main circuit board 61, and by the existence of this duct 71, the cooling air flowing direction is guided. Consequently, the cooling air does not diffuse into the inside of the housing 34 and it is possible to concentratedly guide the cooling air to the first and the second microprocessors 63a, 63b.

In addition, because the first and the second microprocessors 63a, 63b are displaced relative to the flowing direction of the cooling air as well as displaced one another in the direction crossing at right angles with that direction, these microprocessors 63a, 63b are not completely superimposed on each other along the cooling air flowing direction. Consequently, even though the second processor 63b is located in the cooling air flowing direction downstream of the first microprocessor 63a, the cooling air heated by the heat exchange with the first microprocessor 63a is not blown against the second microprocessor 63b and its heat sink 68.

In addition, if the first and the second microprocessors 63a, 63b and heat sinks 68 are displaced one another, it is possible to expose the outer peripheral surfaces of these microprocessors 63a, 63b as well as the outer peripheral surfaces of the heat sinks 68 to the cooling air passage 74 throughout a wide range. Consequently, it is possible to successfully secure the contact area of the cooling air with microprocessors 63a, 63b as well as the cooling air with the heat sinks 68.

As a result, it is possible to increase the cooling efficiency of the first and the second microprocessors 63a, 63b while avoiding the adjacent first and second microprocessors 63a, 63b from exerting thermal influences on each other and without increasing the wind volume of cooling air.

Furthermore, the first and the second microprocessors 63a, 63b slightly overlap in the width direction of the housing 34 as seen from the cooling air flowing direction, and it is possible to reduce the mounting area of the first and the second microprocessors 63a, 63b by the size X of this overlapping portion. Consequently, the main circuit board 61 can be formed in a reduced width, which is favorable for downsizing the housing 34.

In addition, according to the above configuration, the power supply unit 59 that extends in the depth direction of the housing 34 is housed in the inside of the housing 34 at the position deviated to the left side of the first and the second microprocessors 63a, 63b.

Consequently, removing the top plate 37 of the housing 34, and then, pulling the extension support card 92 for supporting the extension card 90 directed upwards, and taking out the duct 71 from the housing body 36 can expose the first and the second microprocessors 63a, 63b above the housing body 36.

Therefore, for example, when the first and the second microprocessors 63a, 63b must be replaced, nuisance and troublesome operation is no longer necessary to remove the heavy and large power supply unit 59 from the housing 34 or assemble it to the housing 34. And the operability when the first and the second microprocessors 63a, 63b are mounted and removed can be improved.

In addition, since the rear plate 40 that support the cooling fans 75, duct 71, and frame 77 are held at the mount surface 61a of the main circuit 61, it is possible to assemble these component elements 40, 71, 77 in the sub-assembly condition which integrates them with the main circuit board 61 into the housing body 36. Consequently, it is no longer necessary to assemble individual component elements 40, 71, 77 into the housing body 36 one at a time, and the operability at the time of assembling the server body 32 can be maintained successfully.

By the way, in the above embodiments, HDD is stacked in the housing height direction in the horizontal position, but the present invention shall not be limited to this, HDD may be raised perpendicularly to be arranged in the width direction of the housing.

Heat generating components is not limited PGA type semiconductor package, but may be a circuit parts accompanying other heat generation. And the number of heat generating components shall not be limited to two but three or more.

Additional advantages and modifications will readily occur to those skilled in the art. Therefore, the invention in its broader aspects is not limited to the specific details and representative embodiments shown and described herein. Accordingly, various modifications may be made without departing from the sprit or scope of the general inventive concept as defined by the appended clams and their equivalents.

What is claimed is:

1. An information processing apparatus comprising:
   a circuit board housed in a housing;
   a duct installed to the circuit board, said duct forming a cooling air passage in the housing;
   at least one cooling fan for feeding cooling air to the cooling air passage;
   first and second heat generating components mounted on the circuit board and located in the cooling air passage, said first and second heat generating components being arranged such that said first and second heat generating components are displaced from each other in a flowing direction of the cooling air in the cooling air passage and displaced from each other in a direction transverse to the flowing direction of the cooling air in the cooling air passage; and
   heat sinks individually and thermally connected to the first and second heat generating components, respectively, the heat sinks having a plurality of radiation fins exposed to the cooling air passage, said radiation fins extending further in the flowing direction of the cooling air in the cooling air passage than in the transverse direction and being spaced from one another in the direction transverse to the flowing direction of the cooling air in the cooling air passage.

2. The information processing apparatus according to claim 1, wherein
   the at least one cooling fan is located at a downstream end of the cooling air passage and discharge the cooling air heated by the first and second heat generating components to the outside of the housing.

3. The information processing apparatus according to claim 2, wherein
   the information processing apparatus includes a pair of cooling fans and the cooling fans are arranged in such a manner as to face the first and second heat generating components, respectively.

4. The information processing apparatus according to claim 1, wherein
   the first and second heat generating components have end sections overlapping each other as seen parallel to the flowing direction of the cooling air in the cooling air passage.

5. The information processing apparatus according to claim 1, wherein
   the duct has a pair of rising plates facing each other with the first and second heat generating components in-between as well as a top plate being laid across top end sections of the rising plates, and the rising plates and the top plate form the cooling air passage in cooperation with the circuit board.

6. An information processing apparatus comprising:
   a housing;
   a circuit board housed in the housing;
   a duct installed to the circuit board, said duct having a pair of rising plates and a top plate, the rising plates and the top plate forming a cooling air passage in cooperation with the circuit board;
   at least one cooling fan for feeding cooling air to the cooling air passage;
   first and second heat generating components mounted on the circuit board and located in the cooling air passage, said first and second heat generating components being arranged such that said first and second heat generating components are displaced from each other in a flowing direction of the cooling air in the cooling air passage and displaced from each other in a direction transverse to the flowing direction of the cooling air in the cooling air passage; and
   heat sinks individually and thermally connected to the first and second heat generating components, respectively, the heat sinks having a plurality of radiation fins exposed to the cooling air passage, said radiation fins extending further in the flowing direction of the cooling air in the cooling air passage than in the transverse direction and being spaced from one another in the direction transverse to the flowing direction of the cooling air in the cooling air passage.

7. An information processing apparatus comprising:
   a housing having a front end portion and a rear end portion;
   a front door having vent holes and being supported at the front end portion of the housing;
   a drive module accommodated in the front end portion of the housing and covered by the front door;
   a duct disposed within the housing, the duct forming a cooling air passage between the drive module and the rear end portion of the housing;
   a cooling fan disposed at the rear end portion of the housing, the cooling fan forming a cooling air flow in the cooling air passage and discharging the cooling air from the rear end portion of the housing to the outside of the housing;
   first and second heat generating components located in the cooling air passage, said first and second heat generating components being arranged such that said first and second heat generating components are displaced from each other in a flowing direction of the cooling air in the cooling air passage and displaced from each other in a direction transverse to the flowing direction of the cooling air in the cooling air passage; and heat sinks individually and thermally connected to the first and second heat generating components, respectively, the heat sinks having a plurality of radiation fins exposed to the cooling air passage.

8. The information processing apparatus according to claim 7, wherein said radiation fins extend in the flowing direction of the cooling air in the cooling air passage and are spaced from one another in the direction transverse to the flowing direction of the cooling air in the cooling air passage.

9. The information processing apparatus according to claim 7, further comprising another cooling fan forming a flow of cooling air in the cooling air passage, said cooling fan and said another cooling fan being disposed on a downstream side of the cooling air passage and opposed to the first and second heat generating components, respectively.

* * * * *